(12) United States Patent
Yu

(10) Patent No.: US 8,918,961 B2
(45) Date of Patent: Dec. 30, 2014

(54) ELECTRONIC DEVICE WITH HINGE STRUCTURE

(71) Applicants: Hong Fu Jin Precision Industry (ShenZhen) Co., Ltd., Shenzhen (CN); Hon Hai Precision Industry Co., Ltd., New Taipei (TW)

(72) Inventor: Zhong-He Yu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/940,460

(22) Filed: Jul. 12, 2013

(65) Prior Publication Data

US 2014/0143983 A1    May 29, 2014

(30) Foreign Application Priority Data

Nov. 26, 2012   (CN) .......................... 2012 1 04856159

(51) Int. Cl.
  *E05D 5/00*     (2006.01)
  *H05K 5/02*    (2006.01)

(52) U.S. Cl.
  CPC ................................... *H05K 5/0226* (2013.01)
  USPC .............................................. 16/382; 16/387

(58) Field of Classification Search
  CPC ....................................................... E05D 3/00
  USPC ............................................. 16/382, 387, 388
  See application file for complete search history.

(56) References Cited

U.S. PATENT DOCUMENTS

| | | | | |
|---|---|---|---|---|
| 5,075,928 A | * | 12/1991 | Bobrowski ...................... | 16/273 |
| 6,038,740 A | * | 3/2000 | Hoger et al. ..................... | 16/382 |
| 6,158,086 A | * | 12/2000 | De Souza ........................ | 16/247 |
| 6,202,256 B1 | * | 3/2001 | Bovio et al. ..................... | 16/382 |
| 6,511,120 B1 | * | 1/2003 | Mitts .............................. | 296/202 |
| 6,584,646 B2 | * | 7/2003 | Fujita .............................. | 16/342 |
| 6,748,625 B2 | * | 6/2004 | Lu ................................... | 16/285 |
| 6,983,514 B2 | * | 1/2006 | Lu et al. .......................... | 16/342 |
| 6,986,188 B2 | * | 1/2006 | Lu et al. .......................... | 16/330 |
| 8,074,322 B2 | * | 12/2011 | Wang et al. ..................... | 16/342 |

* cited by examiner

*Primary Examiner* — Roberta Delisle
(74) *Attorney, Agent, or Firm* — Novak Druce Connolly Bove + Quigg LLP

(57) ABSTRACT

An electronic device includes a first object and a hinge structure. The first object includes a rear plate, and a plurality of positioning posts is located on the rear plate. The hinge structure includes a first connecting member secured to the first object. The first connecting member includes an installation board, and a plurality of installation holes is defined in the installation board, corresponding to the plurality of positioning posts. Each of the plurality of positioning posts is received in each of the plurality of installation holes, so that the installation board directly abuts the rear plate to decrease the thickness of the first object.

17 Claims, 6 Drawing Sheets

ELECTRONIC DEVICE WITH HINGE STRUCTURE

BACKGROUND

1. Technical Field

The present disclosure relates to electronic devices, and more particularly to an electronic device with a hinge structure.

2. Description of Related Art

Many electronic devices, such as notebook computers, utilize hinge structures. A hinge structure is located between a display and a main body of a notebook computer. The hinge structure includes an installation board connected to display via screws, that may increase a thickness of the display. Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
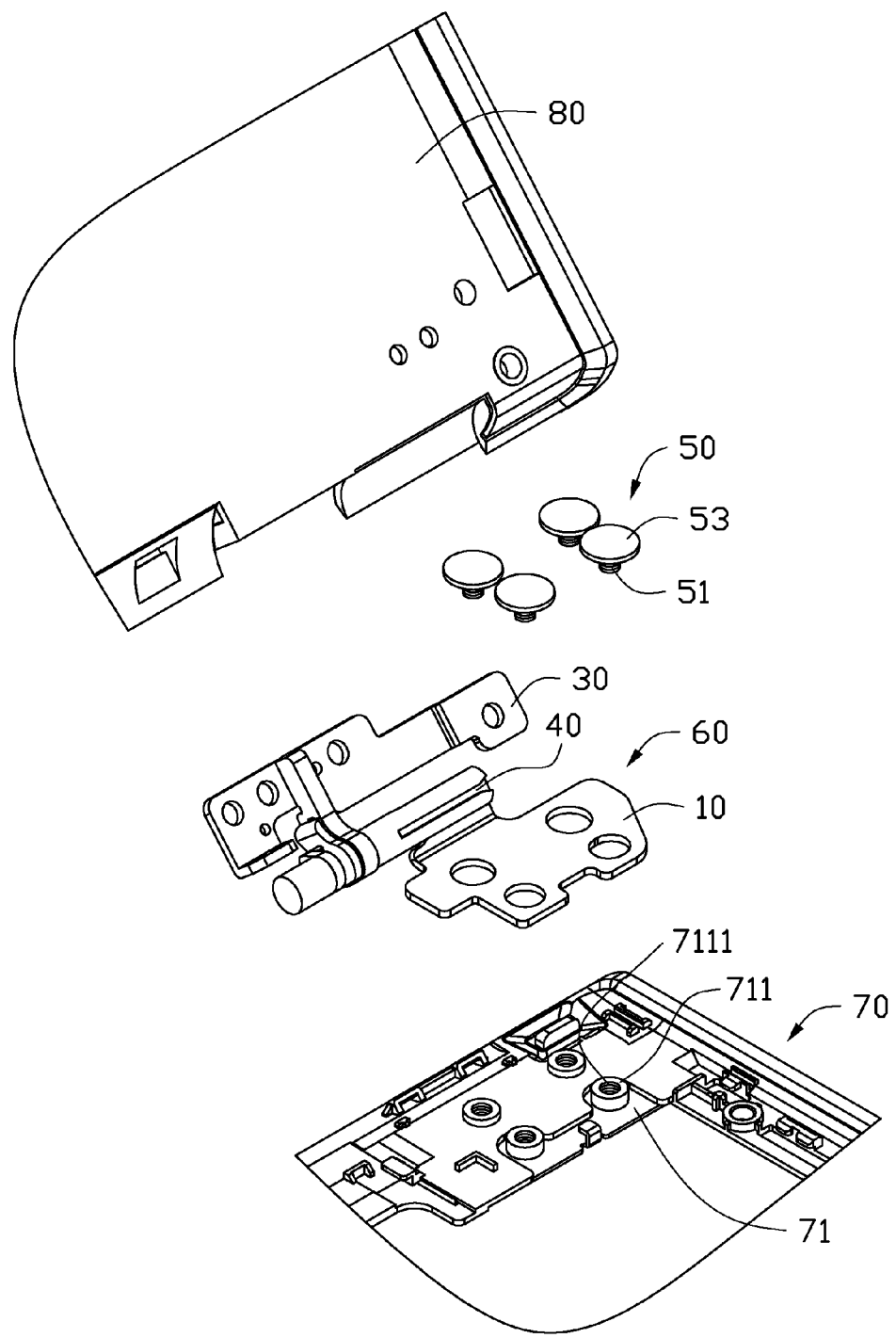
FIG. 1 is an exploded, isometric view of one embodiment of an electronic device, and the electronic device including a first object, a second object, a hinge structure, and a plurality of locking members.

FIG. 1 shows an electronic device in accordance with an embodiment includes a first object 70, a second object 80, two hinge structures 60 (only shown one) connected the first object 70 with the second object 80, and a plurality of locking members 50. In one embodiment, the first object 70 is a display enclosure of a portable computer, and the second object 80 is a base of the portable computer.

Figure 2:
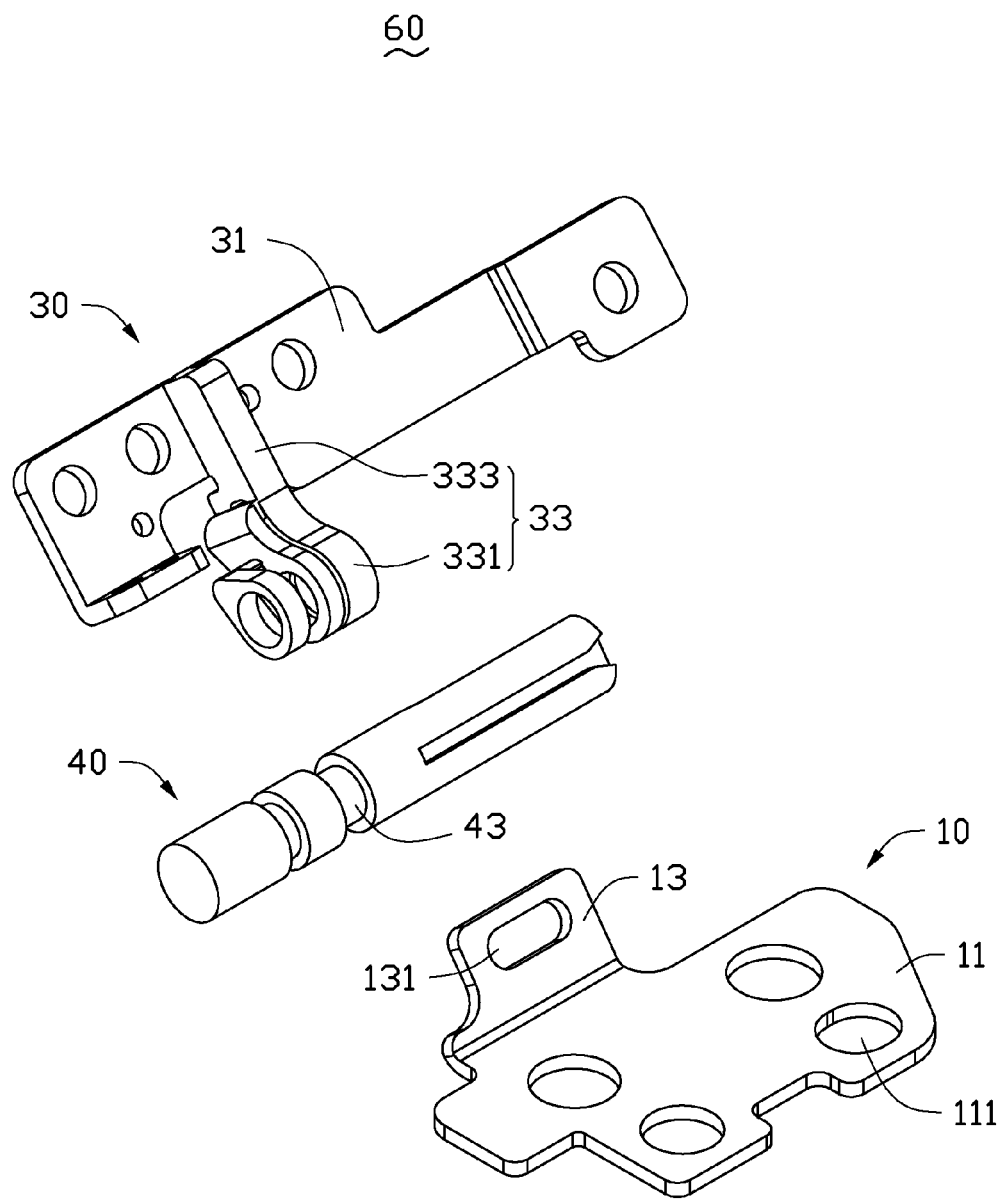
FIG. 2 is an exploded, isometric view of the hinge structure of FIG. 1.
Figure 3:
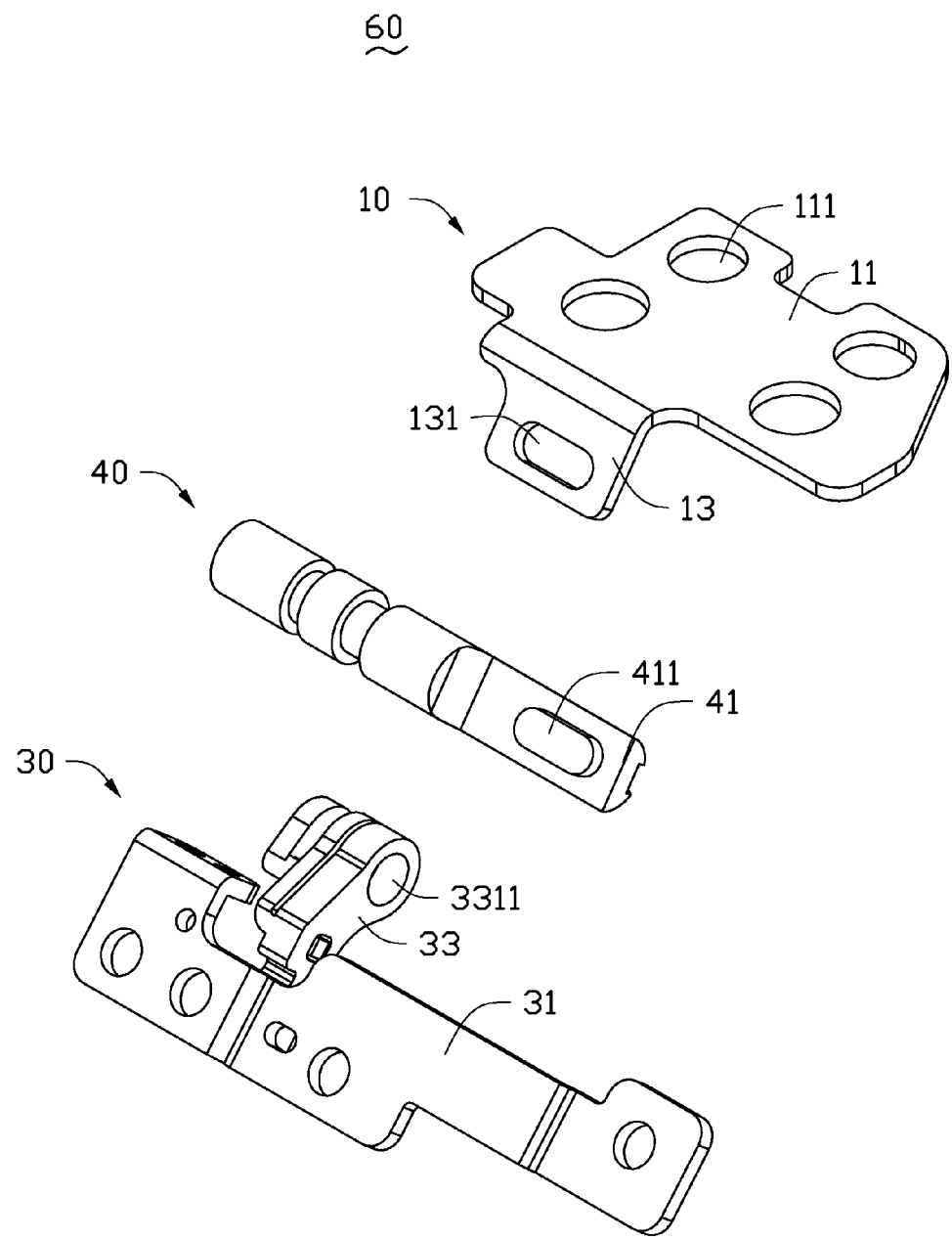
FIG. 3 is similar to FIG. 2, but viewed from a different aspect.

FIGS. 2 and 3 show that each of the two hinge structures 60 includes a first connecting member 10, a second connecting member 30, and a shaft 40. The first connecting member 10 includes an installation board 11 and an engaging piece 13 connected to the installation board 11. The installation board 11 can be secured to the first object 70. In one embodiment, an obtuse angle is defined between the installation board 11 and the engaging piece 13. The installation board 11 defines a plurality of installation holes 111 corresponding to the first object 70. In this embodiment, there are four installation holes 111, and the four installation holes 111 are arranged at four corners of a trapezoid area. The engaging piece 13 defines an engaging hole 131 corresponding to the shaft 40.

The second connecting member 30 includes a securing board 31 and a rotating portion 33 located on the securing board 31. The securing board 31 can be secured to the second object 80. The rotating portion 33 includes rotating arm 333 and a sleeved portion 331 extending from the rotating arm 333. The sleeved portion 331 has a rotating hole 3311 corresponding to the shaft 40.

The shaft 40 defines a section 41 on one end. An engaging portion 411 protrudes from the section 41 corresponding to the engaging hole 131. The shaft 40 defines a circumferential slot 43 corresponding to the sleeved portion 331 of the rotating portion 33.

Each of the plurality of locking members 50 includes a screwed portion 51 and a cap 53 connected to the screwed portion 51. The number of the plurality of locking members 50 is equal to the number of the plurality of installation holes 111.

The first object 70 includes a rear plate 71. In one embodiment, the rear plate 71 is used to clip a monitor (not shown). A plurality of positioning posts 711 is located on the rear plate 71. A threaded hole 7111 is defined in each of the plurality of positioning posts 711, corresponding to each of the plurality of locking members 50. In one embodiment, the diameter of each of the plurality of installation holes 111 is smaller than the diameter of each of the positioning posts 711, so that each of the plurality of the positioning posts 711 can received in each of the plurality of installation holes 111.

Figure 4:
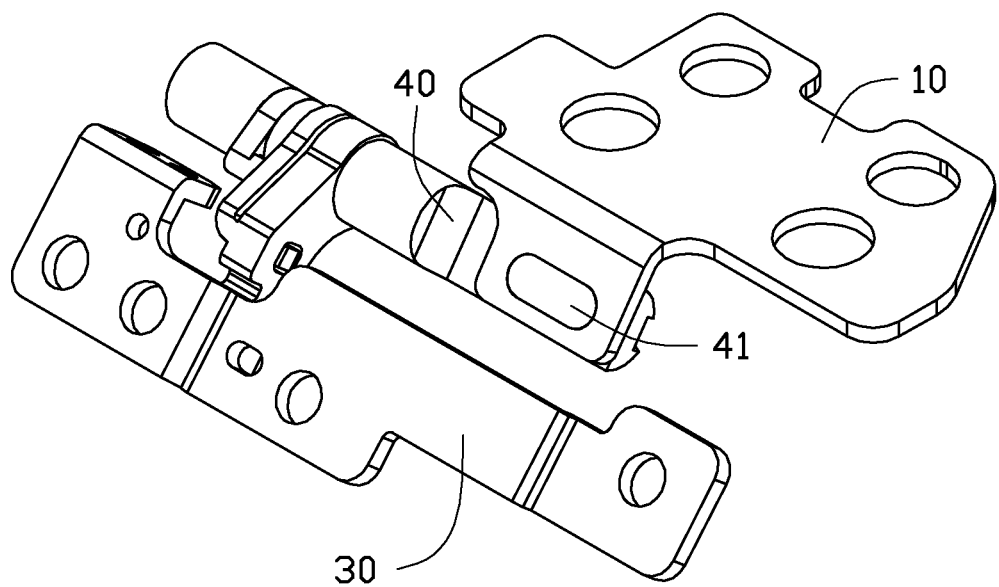
FIG. 4 is an assembled, isometric view of the hinge structure of FIG. 3.

FIG. 4 illustrates that in assembly, the engaging portion 411 of the shaft 40 is engaged in the engaging hole 131 of the first connecting member 10, and then the engaging portion 411 is secured to the first connecting member 10 via a method well know to the art, such as soldering or riveting, and so on. The first connecting member 10 is thereby secured to the shaft 40.

The shaft 40 is inserted into the rotating hole 3311 of the second connecting member 30 to expand the sleeved portion 331, until the sleeved portion 331 is engaged in the circumferential slot 43. The second connecting member 30 is thereby rotatably engaged with the shaft 40.

Figure 5:
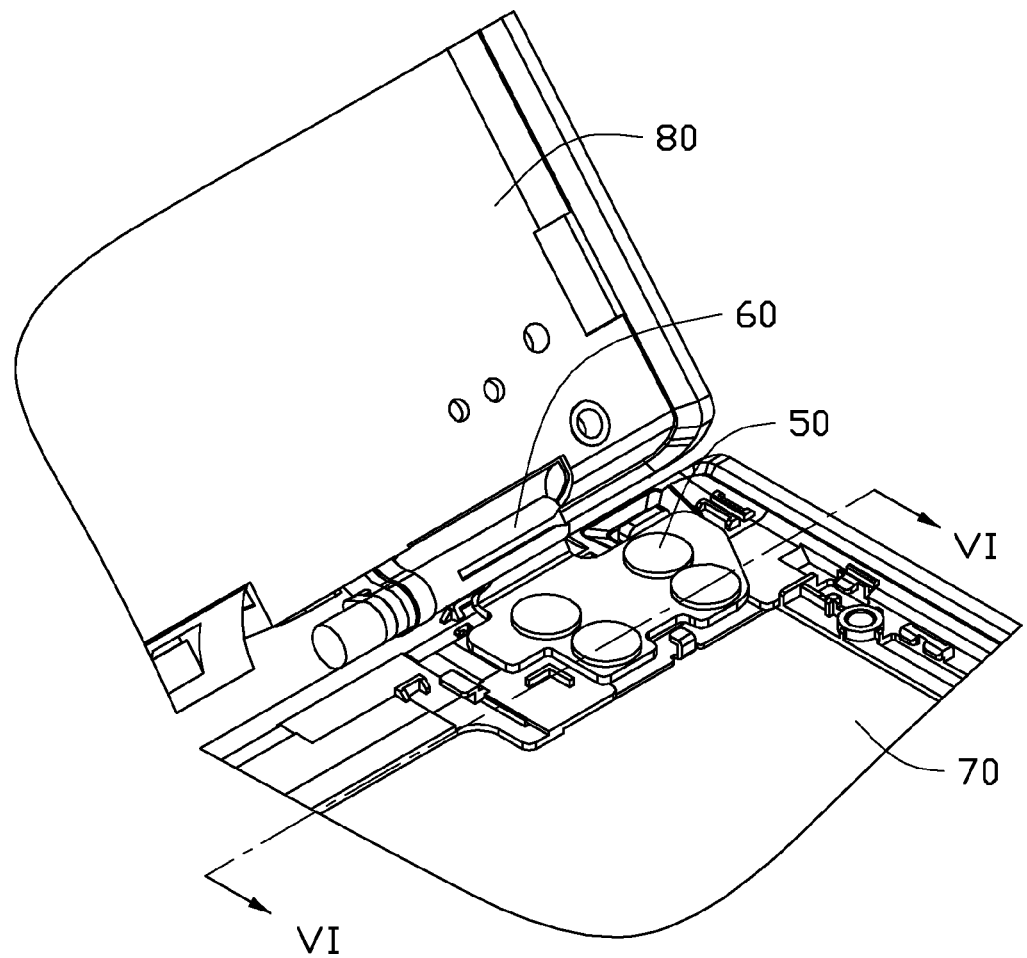
FIG. 5 is an assembled view of FIG. 1.
Figure 6:
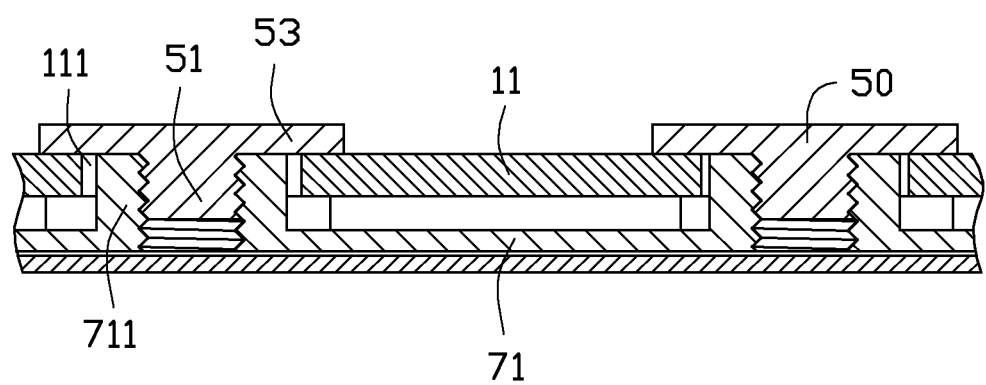
FIG. 6 is a cross-sectional view taken along a line VI-VI of the electronic device of FIG. 1.

FIGS. 5 and 6 show that in assembly of the hinge structure 60, the securing board 31 of the hinge structure 60 is secured to the second object 80 via methods that are well know to the art, such as screws or bolts.

The first connecting member 10 is placed on the first object 70. Each of the plurality of positioning posts 711 is engaged in each of the plurality of installation holes 111, and the installation board 11 abuts the rear plate 71. The screwed portion 51 of each of the plurality of locking members 50 is locked into the each of the plurality of threaded holes 7111, and the cap 53 abuts the installation board 11 of the first connecting member 10. The distance between the cap 53 and the rear plate 71 is equal to the height of the plurality of positioning posts 711, and the thickness of the first object 70 is therefore decreased without the installation board 11 abutting the plurality of positioning posts 711. The first object 70 is rotatable around the hinge structure 60 relative to the second object 80 to open or close the monitor.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and the arrangement of parts within the principles of the disclosure, to the full extent indicated by the broad general meaning of the terms in which the appended claims are expressed.

What is claimed is:

1. An electronic device comprising:
a first object, the first object comprising a rear plate, and a plurality of positioning posts being located on the rear plate; and
a hinge structure comprising a first connecting member secured to the first object, the first connecting member comprising an installation board, and a plurality of installation holes being defined in the installation board, corresponding to the plurality of positioning posts; wherein the installation board is secured to the rear plate, each of the plurality of positioning posts is received in each of the plurality of installation holes, and the installation board abuts the rear plate.

2. The electronic device of claim 1, further comprising a plurality of locking members, wherein each of the plurality of locking members comprises a cap and a screwed portion connected to the cap, the screwed portion of each of the locking members is locked into each of the plurality of positioning posts, and the cap of each of the plurality of locking members abuts the installation board and each of the plurality of positioning posts.

3. The electronic device of claim 2, wherein the distance between the cap of each of the plurality of locking members and the rear plate is substantially equal to the height of each of the plurality of the positioning posts.

4. The electronic device of claim 1, wherein a diameter of each of the plurality of installation holes is greater than an external diameter of each of the plurality of positioning posts.

5. The electronic device of claim 1, wherein the installation board is substantially parallel to the rear plate.

6. The electronic device of claim 1, wherein the thickness of the installation board is smaller than the height of each of the plurality of positioning posts.

7. The electronic device of claim 1, wherein the hinge structure comprises a shaft, the first connecting member comprises an engaging piece connected to the installation board, the engaging piece defines an engaging hole, and an engaging portion is located on the shaft and engaged in the engaging hole.

8. The electronic device of claim 7, further comprising a second object, wherein the hinge structure further comprises a second connecting member, the second connecting member comprises a securing board and a rotating portion located on the securing board, the securing board is secured to the first object, and the rotating portion rotatably surrounds the shaft.

9. The electronic device of claim 8, wherein the rotating portion comprises a rotating arm and a sleeved portion extending from the rotating arm, the sleeved portion surrounds the shaft, and the rotating arm is located on the securing board.

10. An electronic device comprising:
a first object, the first object comprising a rear plate, and a plurality of positioning posts being located on the rear plate; and
a hinge structure comprising a first connecting member secured to the first object, the first connecting member comprising an installation board, and a plurality of installation holes being defined in the installation board, corresponding to the plurality of positioning posts, wherein the installation board is secured to the rear plate, a diameter of each of plurality of installation holes is greater than an external diameter of each of the plurality of positioning posts, to each of the plurality of positioning posts being received in each of the plurality of installation holes, and the installation board abuts the rear plate.

11. The electronic device of claim 10, further comprising a plurality of locking members, wherein each of the plurality of locking members comprises a cap and a screwed portion connected to the cap, the screwed portion of each of the locking members is locked into each of the positioning posts, and the cap of each of the plurality of locking members abuts the installation board and each of the plurality of positioning posts.

12. The electronic device of claim 11, wherein the distance between the cap of each of the plurality of locking members and the rear plate is substantially equal to the height of each of plurality of the positioning posts.

13. The electronic device of claim 10, wherein the installation board is substantially parallel to the rear plate.

14. The electronic device of claim 10, wherein the thickness of the installation board is smaller than the height of each of the plurality of positioning posts.

15. The electronic device of claim 10, wherein the hinge structure further comprises a shaft, the first connecting member comprises an engaging piece connected to the installation board, the engaging piece defines an engaging hole, and an engaging portion is located on the shaft and engaged in the engaging hole.

16. The electronic device of claim 15, further comprising a second object, wherein the hinge structure further comprises a second connecting member, the second connecting member comprises a securing board and a rotating portion located on the securing board, the securing board is secured to the first object, and the rotating portion rotatably surrounds the shaft.

17. The electronic device of claim 16, wherein the rotating portion comprises a rotating arm and a sleeved portion extending from the rotating arm, the sleeved portion surrounds the shaft, and the rotating arm is located on the securing board.

* * * * *